(12) United States Patent
Kotson et al.

(10) Patent No.: US 7,245,501 B2
(45) Date of Patent: Jul. 17, 2007

(54) CONFIGURABLE CIRCUIT BOARD AND FABRICATION METHOD

(75) Inventors: Michael A. Kotson, Fort Collins, CO (US); Robert A. Kubo, Tucson, AZ (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 328 days.

(21) Appl. No.: 10/659,212

(22) Filed: Sep. 9, 2003

(65) Prior Publication Data

US 2005/0052854 A1 Mar. 10, 2005

(51) Int. Cl.
*H05K 7/02* (2006.01)
*H05K 7/06* (2006.01)
*H05K 7/08* (2006.01)
*H05K 7/10* (2006.01)

(52) U.S. Cl. ............... 361/760; 361/763; 361/782
(58) Field of Classification Search ........ 361/760–764, 361/782–785, 777–778; 327/45.01, 277; 216/12–16
See application file for complete search history.

(56) References Cited

U.S. PATENT DOCUMENTS

| | | | |
|---|---|---|---|
| 4,757,610 A | 7/1988 | McElheny et al. | |
| 5,694,028 A | 12/1997 | Salmonson et al. | |
| 5,788,855 A | 8/1998 | Landolf | |
| 5,805,428 A * | 9/1998 | Singer | 361/777 |
| 5,905,885 A * | 5/1999 | Richter et al. | 710/5 |
| 6,346,842 B1 | 2/2002 | Hall, Jr. et al. | |
| 6,931,287 B2 * | 8/2005 | Woltz et al. | 700/65 |

OTHER PUBLICATIONS

PCI Local Bus Specification, Revision 2.3, Mar. 29, 2002, pp. 1-20.

* cited by examiner

*Primary Examiner*—Tuan Dinh

(57) ABSTRACT

Circuit boards capable of receiving different sets of electrical devices are fabricated from raw boards of the same type by forming respective networks of electrically conductive traces with a common layout on the raw boards, including open circuits within the networks. Electrical device receivers and controllers are then loaded on the boards, and some of the open circuits are closed such that some of the boards have different patterns of closed circuits and thereby different interconnections. Some of the receivers can accommodate two different types of electrical devices, with some of the boards configured to support one type and the others another type. The loading of receivers and controllers, and the closing of open circuits, can be performed simultaneously with the placement of zero ohm resistors used for circuit closings. Numerous different circuit board configurations can thus be supported from a common supply of raw boards.

16 Claims, 11 Drawing Sheets

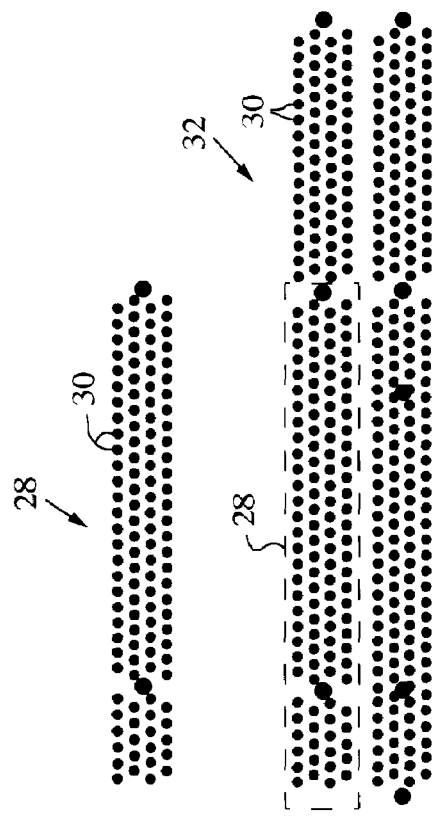
Fig. 2a (Prior Art)
Fig. 2b (Prior Art)
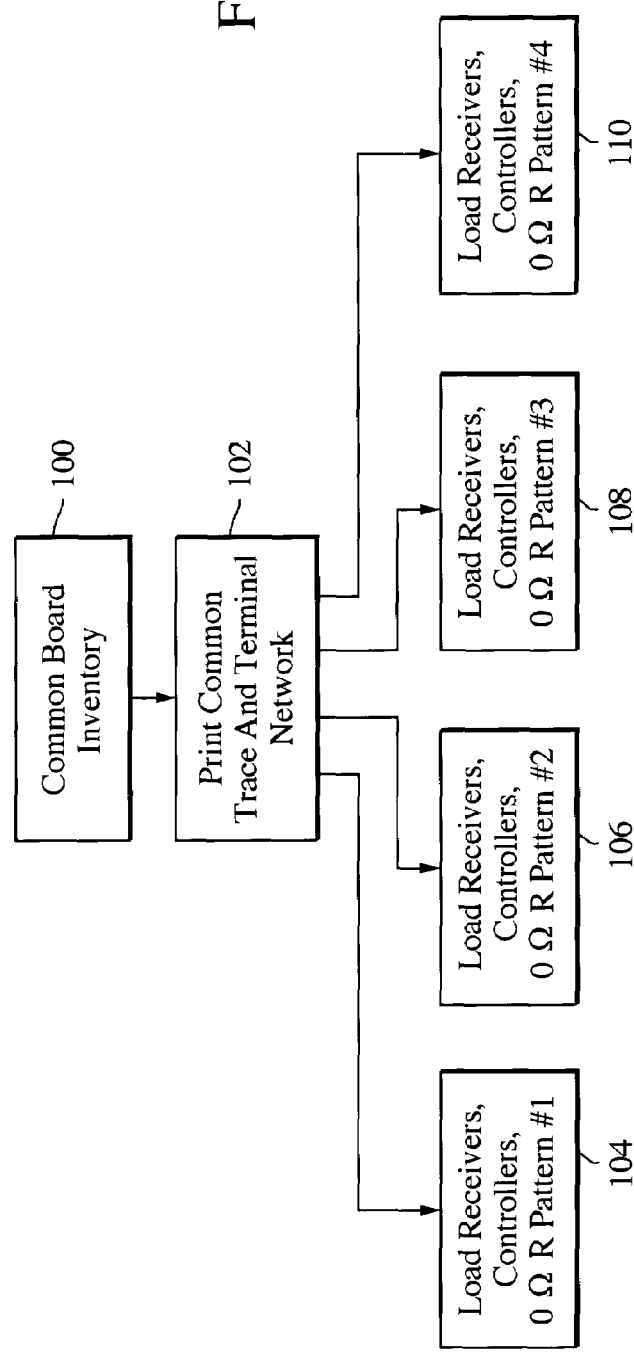
Fig. 9

CONFIGURABLE CIRCUIT BOARD AND FABRICATION METHOD

BACKGROUND

Local buses have been developed so that the system buses of a computer system can be accessed at speeds close to that of the microprocessor. Of these, the PCI local bus is now the most widely accepted and implemented expansion system. This local bus is a high performance 32-bit or 64-bit bus with multiplexed address and data lines, and is intended for use as an interconnect mechanism between highly integrated peripheral controller components, peripheral add-in cards and processor/memory systems. The bus allows burst mode data transfer and bus mastering, and is usable with many different kinds of add-in cards, such as graphical user interfaces, modems, network cards, sound, video capture and SCSI cards. Some of the cards are 32-bit, operating at 33 MHz, while others are 64-bit, operating at either 100 MHz or 133 MHz. The 32-bit bus is designated PCI, while the 64-bit is designated PCI-X. A different controller is required for each bus, such as the ICH4 32-bit controller and P64H2 64-bit controller by Intel Corporation.

Personal computer (PC) mother boards can have numerous different configurations, depending upon the type of circuit cards they are set up to receive. For example, if all of the cards for which they system is designed are 32-bit cards, then a number of receivers (commonly called "slots"), each designed to receive the 120 edge pins of a 32-bit card, would be provided on the board, along with an ICH4 controller connected to each of the slots in parallel. If, on the other hand, only 64-bit cards need to be accommodated, a different board with slots for the 368 edge pin 64-bit cards would be used, together with an appropriate number of P64H2 controllers (in general, one P64H2 controller is required for each two 64-bit cards operated at 100 MHz, and an individual controller for each 64-bit card operated at 133 MHz).

If, as is frequently the case, some combination of 32-bit and 64-bit cards are to be accommodated, separate boards with appropriate arrays of 32-bit and 64-bit slots and controllers are provided for each different combination. In general, each different board design is considered as a separate part, with separate order and fabrication sequences. Thus, it may be necessary for a manufacturer to inventory a large number of different boards, each with a different combination of slots and controllers, and to order new raw boards separately for each different design. The separate board designs can lead to a relatively large number of orders for relatively low volumes of boards each, which does not offer the opportunity to maximize volume discounts.

Different types of mother boards have conventionally been characterized by different numbers of circuit card slots associated with the ICH4 and P64H2 controllers, and also by the number of P64H2 controllers and whether their associated slots are intended for 133 MHz or 100 MHz operation. This type of characterization has resulted in a proliferation of different types of circuit boards, with separate inventories of raw boards for each type. New raw boards are generally acquired only when the stock of raw boards for one particular type of mother board needs to be replenished. Thus, while the collective number of raw circuit boards purchased for all types of mother boards over a given period of time may be large, the number of boards purchased with each individual order will generally be much smaller, with a corresponding loss of volume discounts and economies of scale. Mother boards with different configurations of slots controlled by the ICH4 and P64H2 controllers require different interconnection networks between the controllers and slots; the different interconnection networks emphasize the tendency to consider each different combination of slots as a separate part requiring a separate board inventory and fabrication process.

SUMMARY

The invention includes a method of fabricating a plurality of circuit boards for receiving different sets of electrical devices from a plurality of raw boards of the same type. The method comprises forming respective networks of electrically conductive traces with a common layout on the raw boards, said networks each comprising a plurality of open circuits; loading respective pluralities of electrical device receivers on the boards; loading respective electrical device controllers on the boards; and closing some of the open circuits, such that some of the boards have different patterns of closed circuits and thereby different interconnections between their respective receivers and controllers.

In one embodiment, each of the networks comprises a common plurality of open circuit resistor terminal pairs. Respective pluralities of pin receptacle arrays and controllers are loaded in a common pattern on the board. Zero ohm resistors are loaded across respective terminal pairs on at least some of the boards simultaneously with the loading of the pin receptacle arrays and controllers, such that some of the boards have different patterns of zero ohm resistors, and thereby different interconnections between their respective arrays and controllers.

The invention also contemplates a configurable circuit board comprising a substrate; a plurality of electrical device receivers configured to receive a selectable one of multiple different electrical devices having different respective interfaces with the receivers; a plurality of controllers on the substrate for the receivers; and an electrically conductive interconnection network on the substrate interconnecting the controllers with the receivers, said network comprising sets of zero ohm resistor terminals that enable at least some of the receivers to be connected to different controllers, depending upon a pattern of zero ohm resistors connected across the terminals.

These and other objects and features of the invention will be apparent to those skilled in the art from the following detailed description, taken together with the accompanying drawings.

BRIEF DESCRIPTION OF THE DRAWINGS

FIGS. 2*a* and 2*b* are plan views of pin arrays in conventional receivers for 32-bit and 64-bit circuit cards, respectively;

FIG. 9 is a flow diagram of a circuit board fabrication process in accordance with one embodiment of the invention.

DETAILED DESCRIPTION OF EMBODIMENTS OF THE INVENTION

Figure 1:
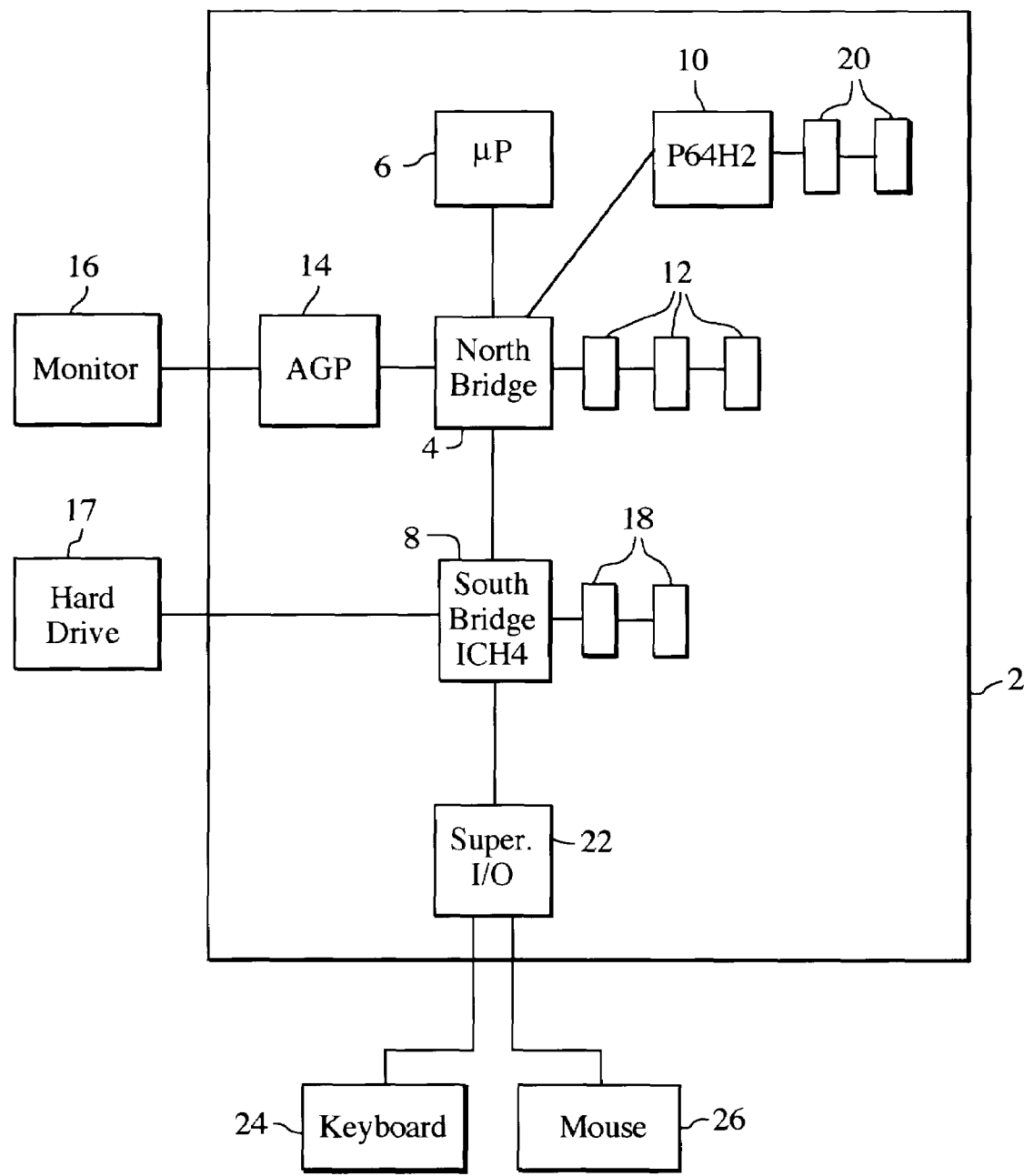
FIG. 1 is a block diagram of a PC mother board to which the invention is applicable.

FIG. 1 illustrates a PC mother board 2 to which the invention is applicable. The heart of the computer is the north bridge 4, which is an industry term for a central controller for functions such as memory and graphics, and high speed interfaces to other controllers on the board. In this particular illustration, the north bridge 4 is shown having high speed interfaces with the computer's microprocessor 6, an ICH4 PCI controller 8 (conventionally referred to as a "south bridge"), and a P64H2 PCI controller 10. The north bridge is also shown as controlling a series of memory slots 12, an accelerated graphics port (AGP) 14 which is normally internal to the north bridge and controls an off-board monitor 16, and an off-board hard drive 17. The ICH4 controller 8 interconnects with a number of slots 18 which are configures to receive 32-bit circuit cards, while the P64H2 controller 10 interconnects with a number of slots 20 that are configured to receive 64-bit circuit cards. The ICH4 controller 8 is also illustrated as controlling a supervisory input/output controller 22 for an off-board keyboard 24 and mouse 26. Although specific 32-bit and 64-bit controllers are referred to in this description, controllers from other sources could also be used.

FIG. 2a shows the standardized array 28 of pin receptacles 30 used to receive a 32-bit PCI circuit card; the edge pins on the card would have a matching pattern. FIG. 2b shows the standardized array 32 of pin receptacles 34 for a 64-bit PCI circuit card. The 32-bit pin pattern 28 is incorporated as part of the overall 64-bit pin pattern. In this respect, the 32-bit pin pattern can be considered as a "core" array that is common to both 32-bit and 64-bit receivers. This feature enables the use of a common circuit board layout as a source for circuit boards with numerous different configurations of 32-bit receivers, 64-bit receivers and corresponding controllers.

Figure 3:
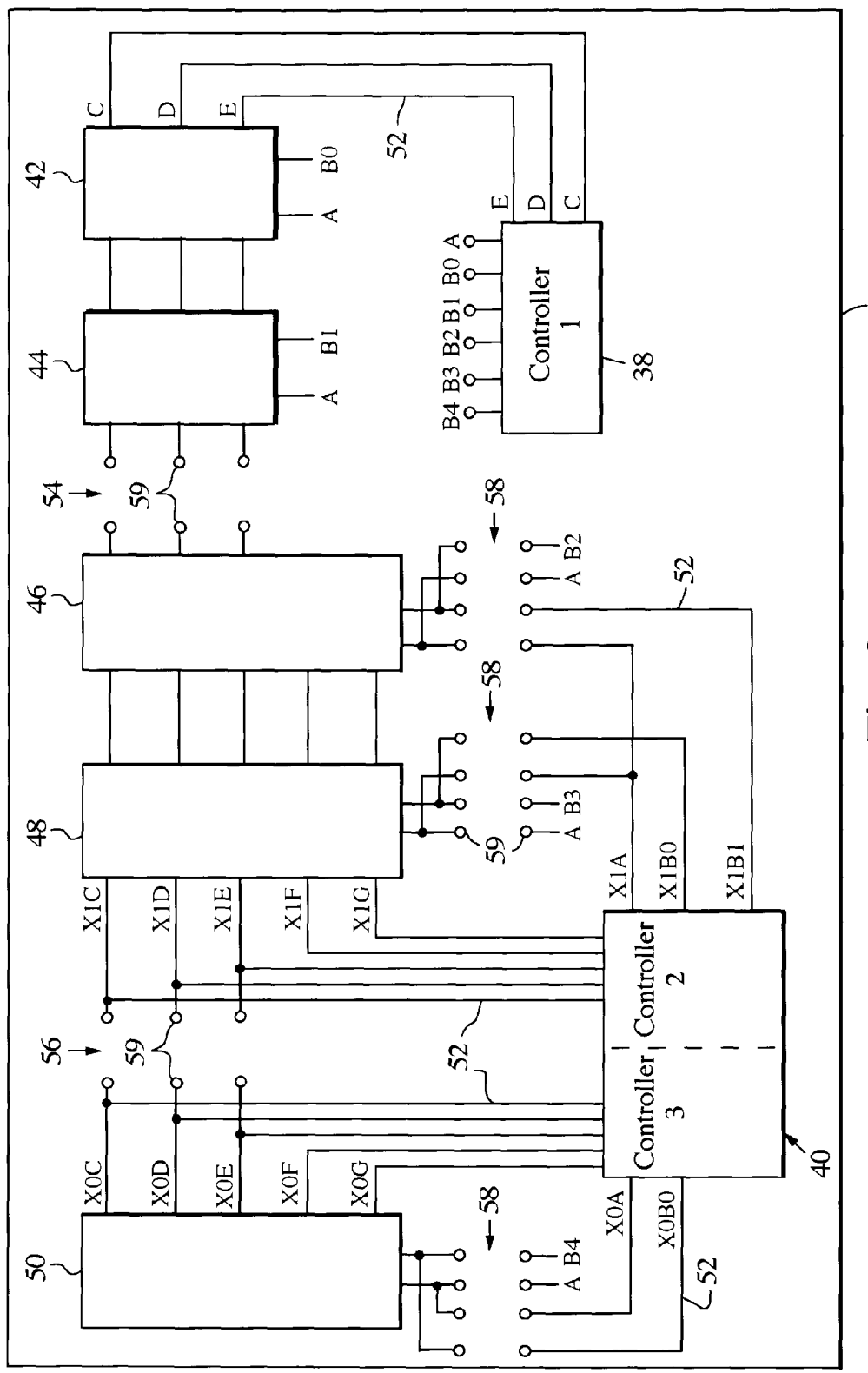
FIG. 3 is a plan view of a simplified board layout in accordance with one embodiment of the invention, prior to configuration for a specific application.

FIG. 3 illustrates one example of a circuit board 36 with a layout that can be configured to receive and control various combinations of 32-bit and 64-bit circuit cards. Only elements of a PC mother board that are directly pertinent to the invention are shown; other elements such as the microprocessor, memory slots and accelerated graphics port would normally also be present. The board functions as a substrate to carry a first controller 38, which may be an ICH4 south bridge and is designated Controller 1, and a P64H2 controller 40 which is implemented as two separate controller segments designated Controllers 2 and 3.

A desired combination of 32-bit and 64-bit receivers is also provided on the board. In this example, two 32-bit receivers 42 and 44 are provided, while three 64-bit slots 46, 48 and 50 are provided in proximity to the P64H2 controller 40. As shown, the controllers are connected to the circuit card receivers through a network of electrically conductive traces 52 on the board. Open circuits are left at strategic locations in the trace network to enable the board to be configured for different combinations of 32-bit and 64-bit circuit cards. In the example shown, open circuits 54 are left between the 32-bit receiver 44 and 64-bit receiver 46, open circuits 56 are left between the 64-bit receivers 48 and 50, and additional sets of open circuits 58 are left between the controllers and the 64-bit circuit cards.

Three interconnections C, D and E are shown between Controller 1 and the 32-bit receivers 42 and 44, but separated from the 64-bit receivers by open circuits 54, with additional open circuits 56 in continuations of these traces between 64-bit receivers 48 and 50. The designations C, D and E are arbitrary, and are intended to stand for a larger number of interconnections between Controller 1 and the 32-bit receivers. The actual standard PCI designations for these lines are given in FIGS. 5–8. Similarly, output A from controller 1 is shown connected directly to the two 32-bit receivers 42 and 44, and through open circuits 58 to each of the 64-bit receivers, while outputs B0, B1, B2, B3 and B4 are respectively connected directly to 32-bit receivers 42 and 44 and through corresponding open circuit 58 to 64-bit receivers 46, 48 and 50. Controller 2 is illustrated as providing outputs X1C, X1D, X1E, X1F and X1G directly to 64-bit receivers 46 and 48, output X1A to receivers 46 and 48 through corresponding open circuits 58, output X1B0 to receiver 48 through another open circuit 58, and also output X1B1 to receiver 46 through a further open circuit 58. Controller 3 is illustrated as being connected directly to only one receiver, providing outputs X0C, X0D, X0E, X0F, X0G to receiver 50, while also providing outputs X0A and X0B0 to the same receiver through respective open circuits 58.

Each of the open circuits in this embodiment are bounded by terminals 59 that can be in the form of resistor pads to receive opposite ends of a zero ohm resistor so that, when a zero ohm resistor is in place between two traces that terminate in opposing terminals, a short circuit is formed that effectively joins the two traces into a single conductive line.

Zero ohm resistors are conventional devices that have the "footprint" of a standard resistor, but a resistance approaching zero. Several implementations are possible, such as a resistor with a cylindrical copper core disposed between its end caps as described in U.S. Pat. No. 4,757,610. Such resistors have been used in various applications, such as to select one of multiple different delay paths for inclusion in a circuit (U.S. Pat. No. 6,346,842), substituting for a power transistor to short circuit two voltage supply lines when only one is needed (U.S. Pat. No. 5,694,028), choosing between a transistor or a closed circuit (U.S. Pat. No. 5,805,428) or connecting traces on a printed circuit board to modify the routing configuration (U.S. Pat. No. 5,788,855). The term "zero ohm" as used herein is not intended to require an absolute zero level of resistance, but rather a resistance low enough that it effectively functions as a short circuit for purposes of overall system operation.

In the described embodiments of the present invention, the circuit board can be configured to accept different combinations of 32-bit and 64-bit circuit cards by short circuiting selected combinations of open circuits, and leaving the remainder open. Various mechanisms can be provided for this purpose, such as connecting a simple metal link between the traces to be shorted together, or initially providing short circuits across all of the sites and then opening selected ones. However, zero ohm resistors are preferred because they can easily be loaded onto the board in the same fabrication step used to load the receivers and controllers by automated equipment such as available pick-and-place machines. Thus, the use of zero ohm resistors adds neither time nor complexity to the fabrication process. They can also be used to select between the conventional voltage supply levels for the different cards (5 volts for 32-bit, 3.3 volts for 64-bit).

Figure 4A:
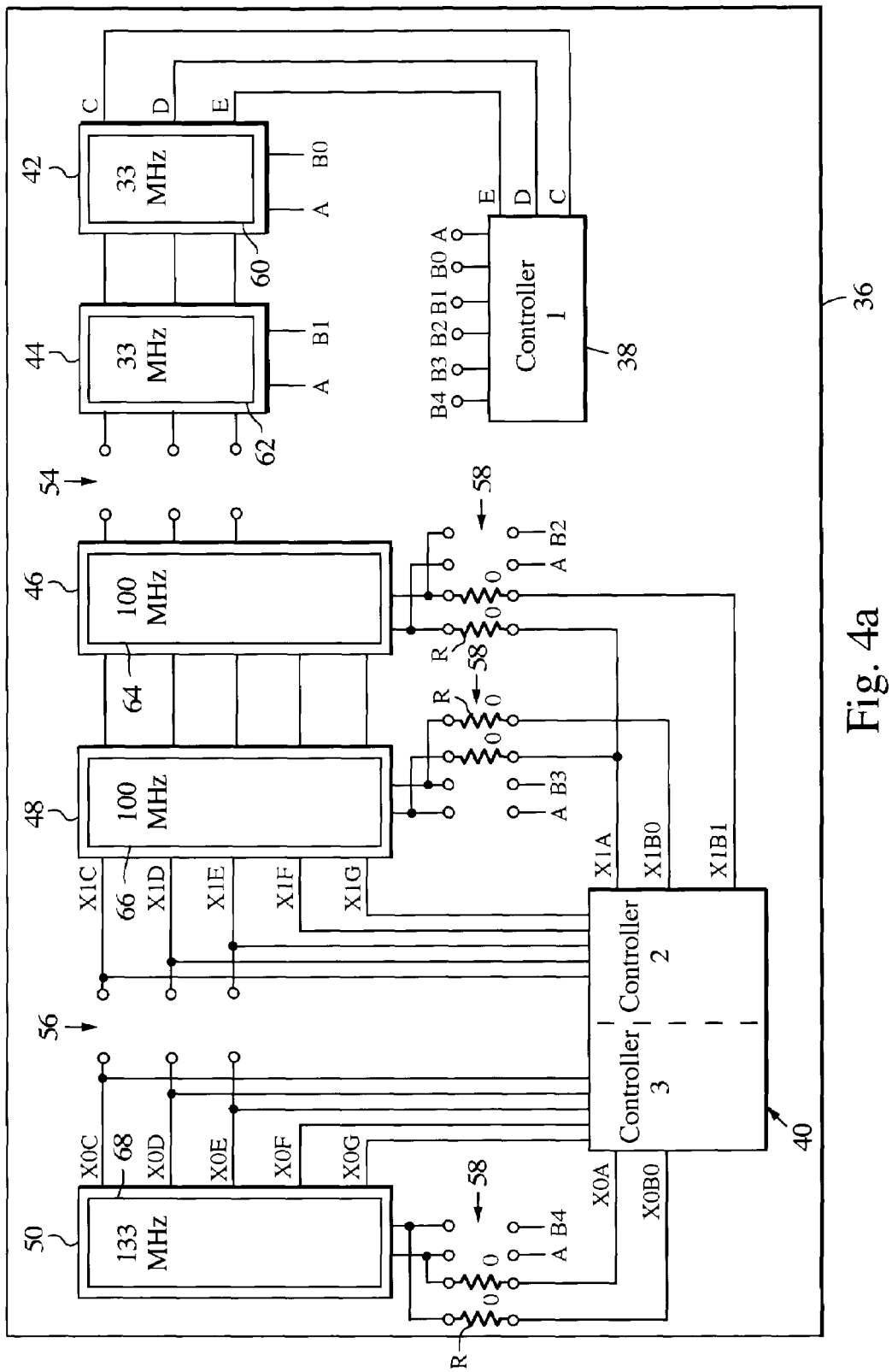
FIGS. 4*a*, 4*b*, 4*c* and 4*d* are plan views illustrating the board layout of FIG. 3 configured for circuit card combinations comprising one 133 MHz, two 100 MHz and two 33 MHz circuit cards; one 100 MHz and four 33 MHz circuit cards; five 33 MHz circuit cards; and three 100 MHz and two 33 MHz circuit cards, respectively.

FIGS. 4a–4d show the board layout of FIG. 3 configured for different combinations of 32-bit and 64-bit circuit cards, and also different operating speeds. In FIG. 4a, 32-bit cards 60 and 62 are shown inserted in 32-bit slots 42 and 44, while 64-bit cards 64, 66 and 68 are inserted in slots 46, 48 and 50, respectively; cards 64 and 66 are operated at 100 MHz, and card 68 at 133 MHz. The interconnection network between the controllers and receivers is configured accordingly, with open circuits 54 and 56 left intact, zero ohm resistors R shorting the open circuits between the outputs of Controllers 2 and 3 and receives 46, 48 and 50, and the open circuits between the outputs of Controller 1 and receivers 46, 48 and 50 left open. In this way, Controller 1 controls the 33 MHz operation, Controller 2 the 100 MHz operation, and Controller 3 the 133 MHz operation.

Figure 4B:
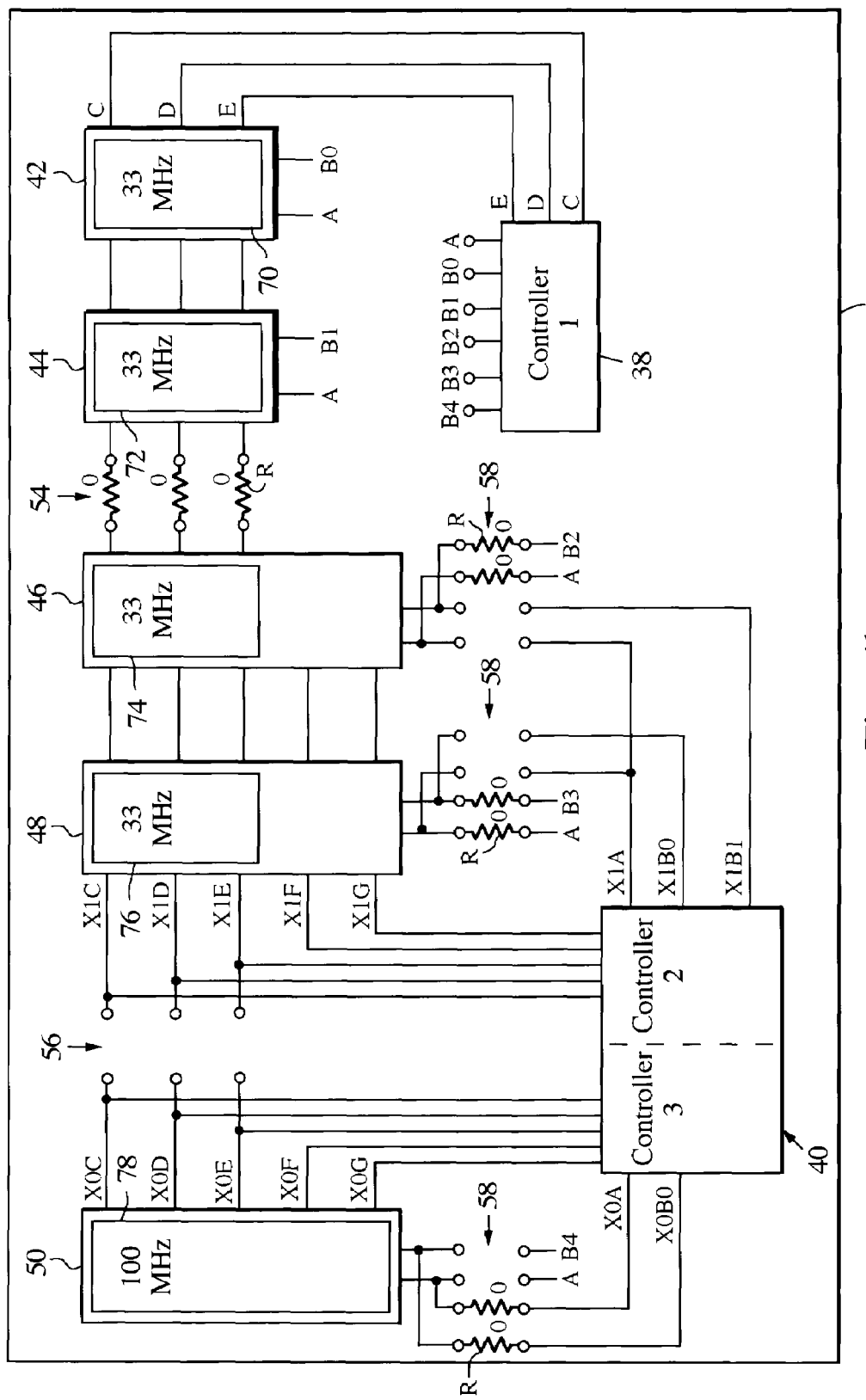

FIG. 4b illustrates a different configuration, with 32-bit cards 70, 72, 74 and 76 inserted into 32-bit receivers 42, 44 and 64-bit receivers 46, 48, respectively. The 32-bit cards 74 and 76 occupy only the "core" receptacle patterns of their corresponding receivers 46 and 48, with the remaining pin receptacles in those receivers left vacant. A 64-bit card 78, illustrated with a 100 MHz operation, is inserted into the final 64-bit receiver 50.

With this combination of circuit cards, zero ohm resistors R are placed across the terminals of open circuits 54 so that 64-bit slots 46 and 48 are controlled in parallel with 32-bit slots 42 and 44 by Controller 1, while Controller 3 controls card 78. Zero ohm resistors are also placed across the open circuits between Controller 1 and the A, B2 and B3 inputs to receivers 46 and 48, and between the X0A and X0B0 lines between Controller 3 and receiver 50. Since Controller 2 is not used in this embodiment, the controller would generally not be loaded onto the board to begin with.

Figure 4C:
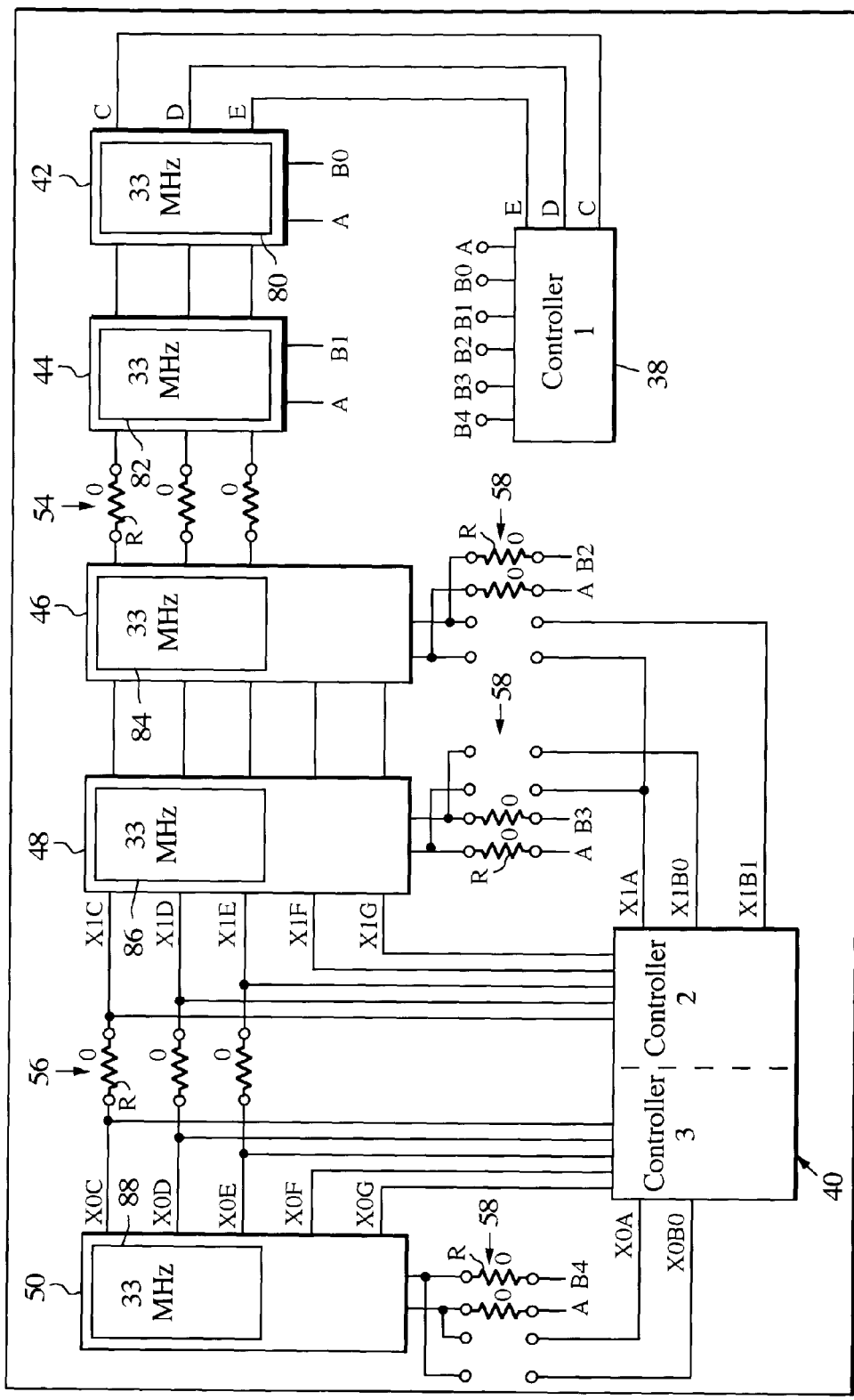

FIG. 4c shows another variation, with 32-bit cards 80, 82, 84, 86 and 88 loaded into each of the receivers 42, 44, 46, 48 and 50, respectively. Since all of the cards are under the control of Controller 1 in this embodiment, zero ohm resistors are placed across open circuits 54 and 56, and also across the open circuits in the A, B2, B3 and B4 lines to 64-bit receivers 46, 48 and 50. Since controllers 2 and 3 are not used, they would normally not be loaded onto the board.

Figure 4D:
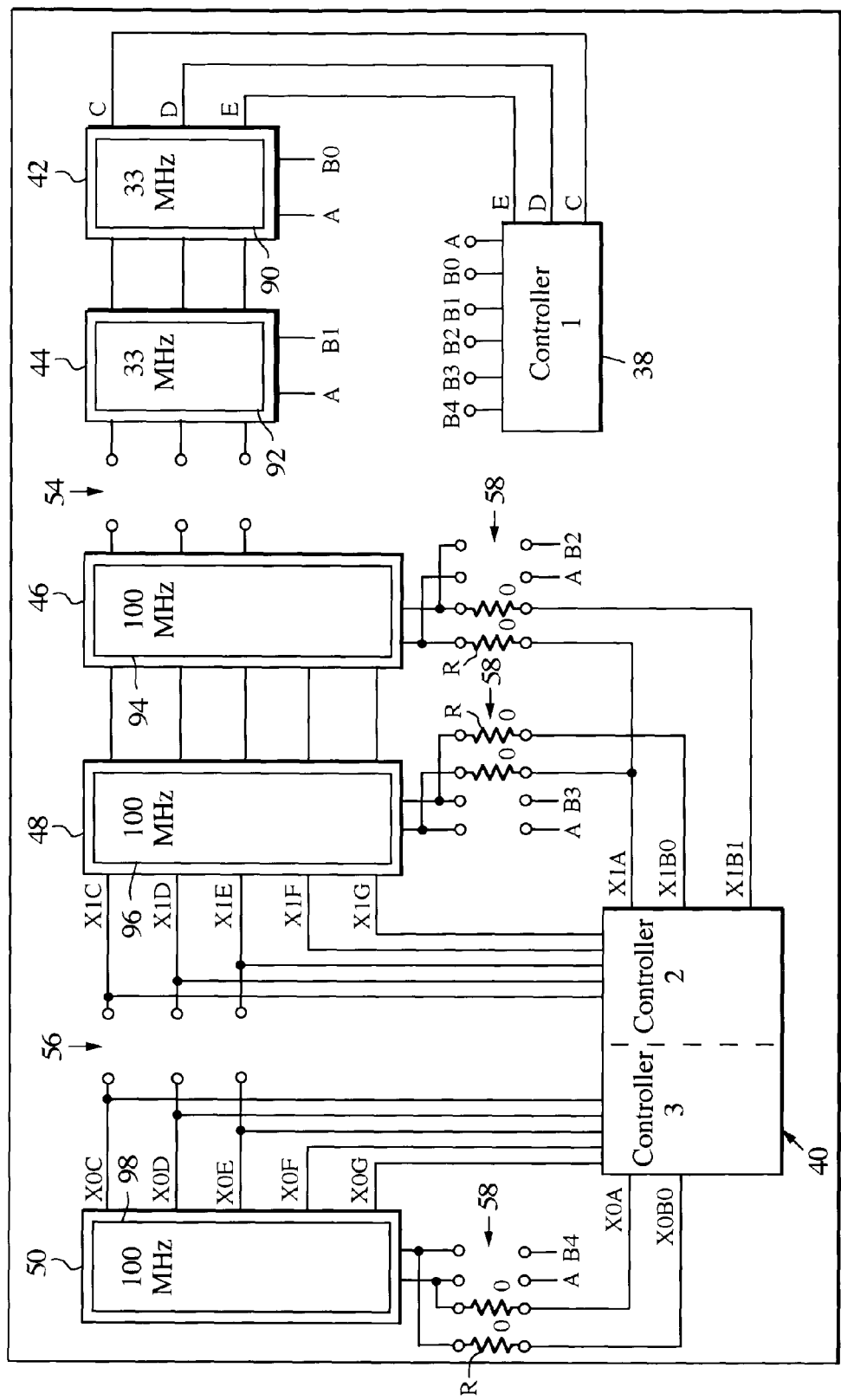
Figure 5:
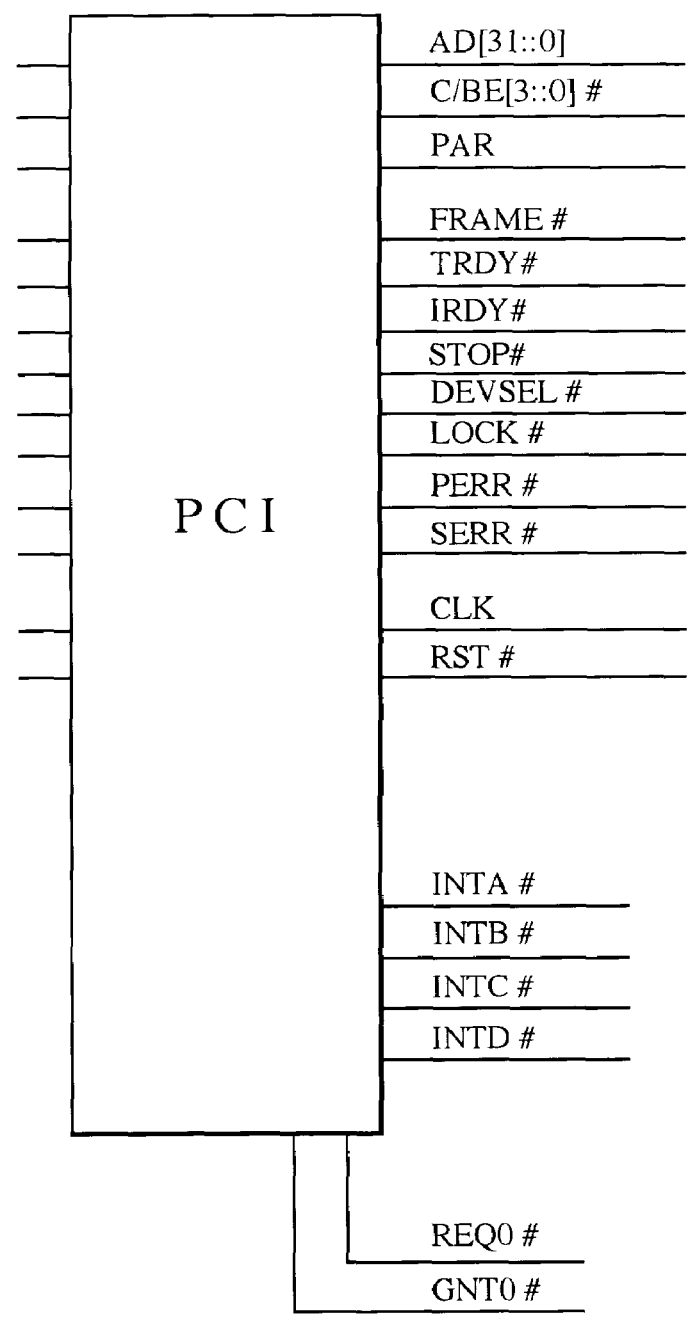
FIGS. 5 and 6 are schematic diagrams of 32-bit and 64-bit cards, respectively, showing connections relevant to the invention with conventional PCI nomenclature.
Figure 6:
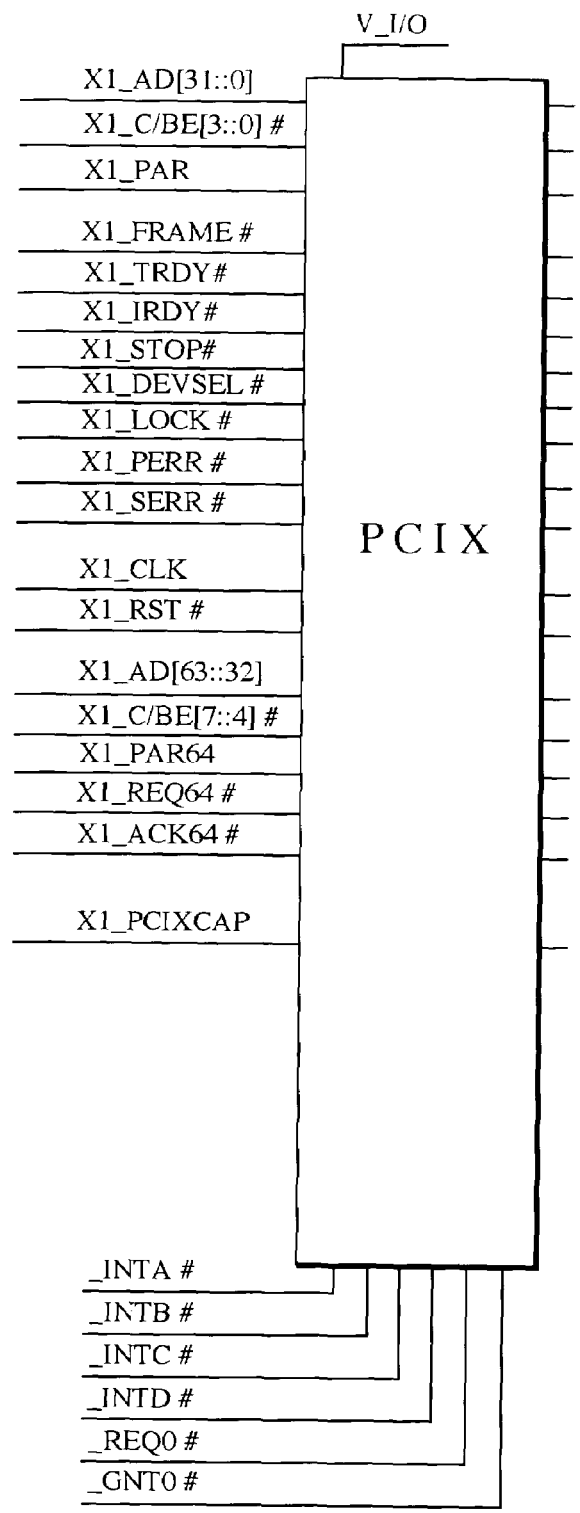
Figure 7:
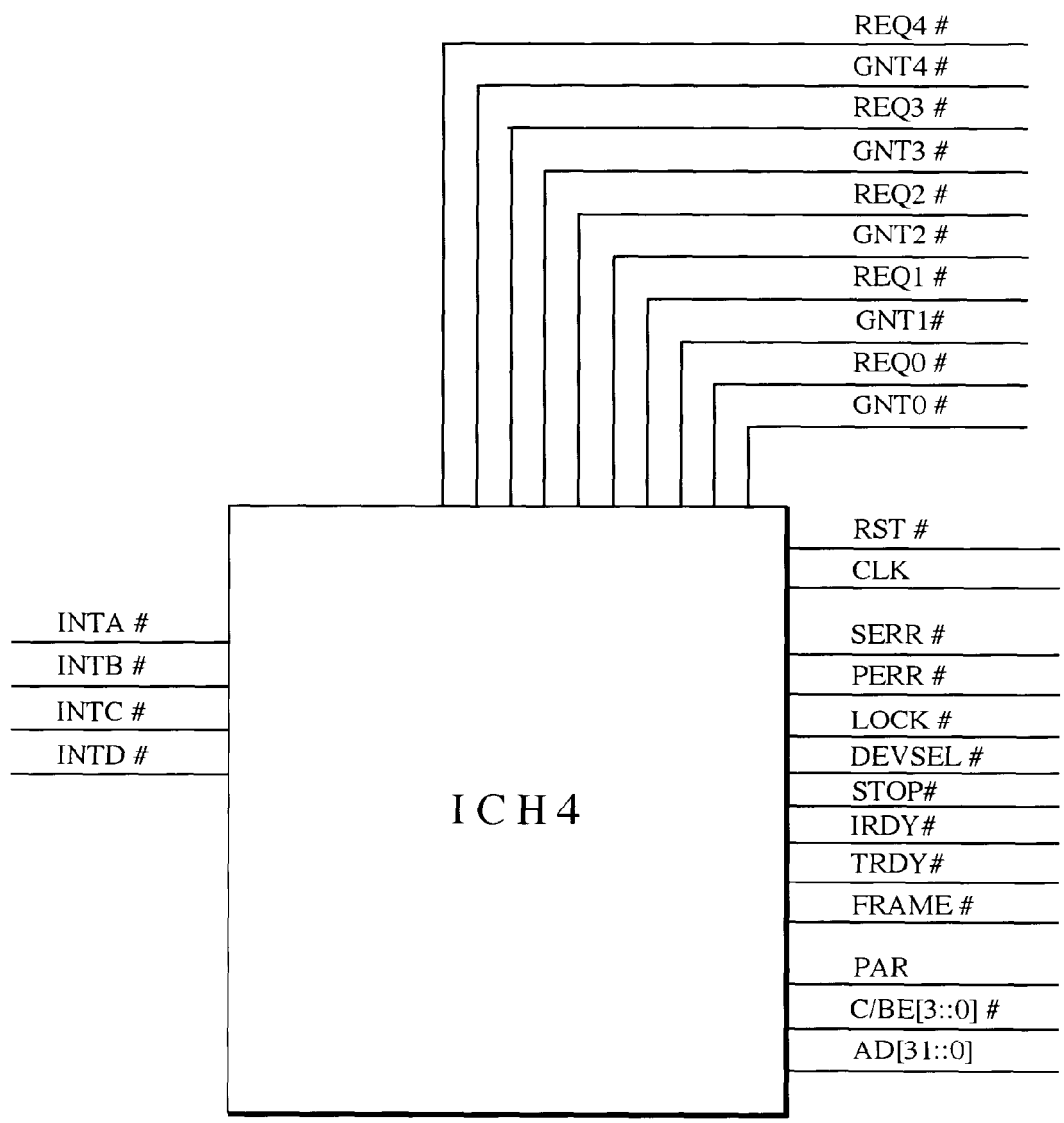
FIGS. 7 and 8 are schematic diagrams of ICH4 and P64H2 controllers, respectively, showing connections relevant to the invention with conventional PCI nomenclature.
Figure 8:
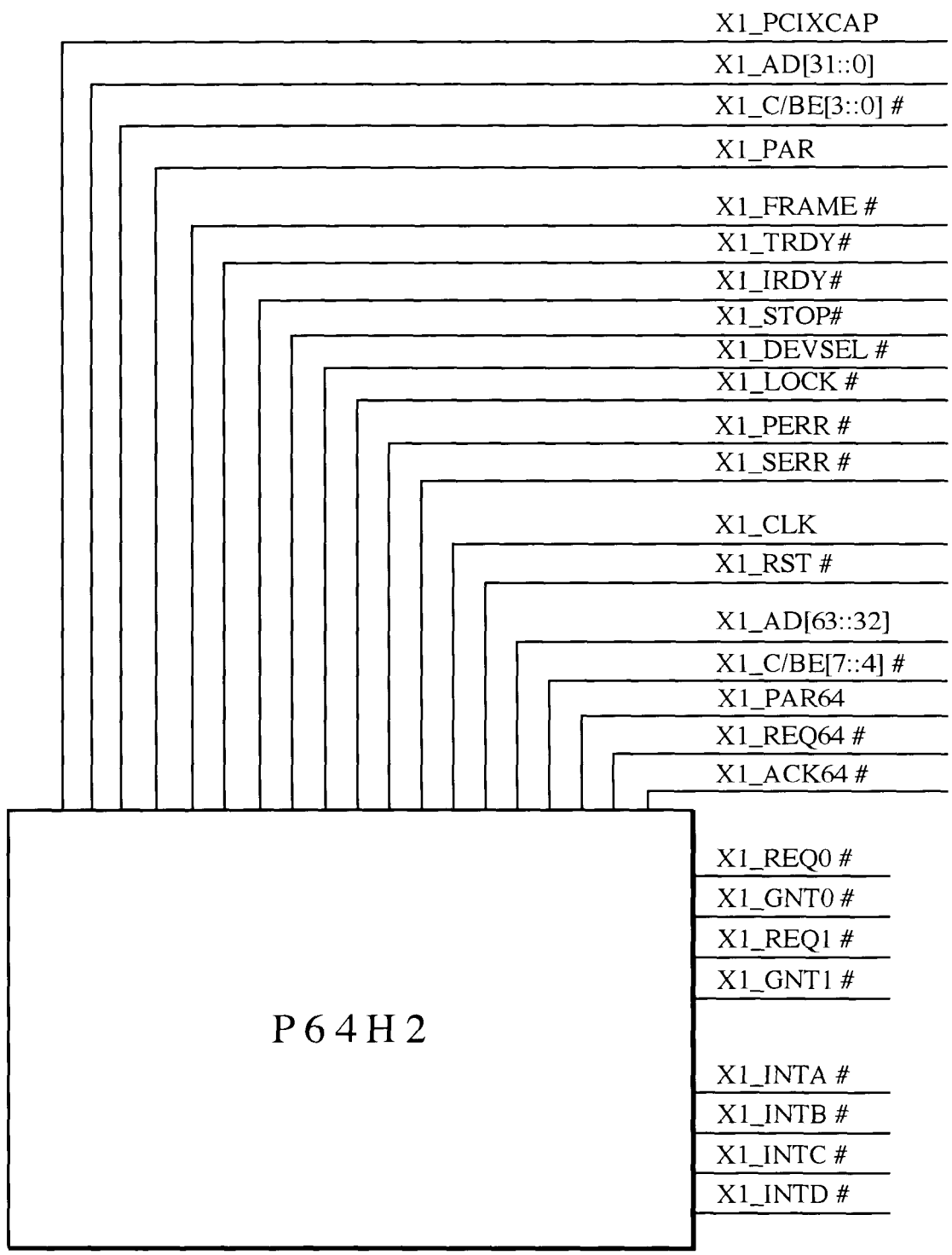

FIG. 4d illustrates yet another variation, with 32-bit cards 90 and 92 inserted into 32-bit receivers 42 and 44, respectively. 64-bit cards 94, 96 and 98 and inserted into 64-bit receivers 46, 48 and 50, respectively, and each operated at 100 MHz. While theoretically each of the 64-bit cards might be operated from Controller 2, in practice a single P64H2 controller can be used for only two 64-bit cards at 100 MHz. Accordingly, open circuits 56 are left open. The placement pattern of zero ohm resistors R is the same as in FIG. 4a, so that Controller 1 controls slots 42 and 44, Controller 2 controls slots 46 and 48, and Controller 3 controls slot 50.

While simplified examples of different mother board configurations have been shown, numerous other combinations of controllers, receivers and circuit cards are within the scope of the invention. When a common pattern of receivers is used for each of the boards, a common network of conductive traces and open circuits would also normally be employed. The common network could be used for different applications, depending upon the particular combinations of circuit cards and zero ohm resistors in each application.

FIGS. 5, 6, 7 and 8 illustrate the standard PCI connections for the 32-bit slot 42 (and also 44), the 64-bit slot 46 (and also 48 and 50), the ICH4 controller 38, and the P64H2 controller 40, respectively. These figures use the industry standard signal definitions set forth in *PCI Local Bus Specification*, PCI Special Interest Group, Portland, Oreg., Revision 2.3, Mar. 29, 2002, Chapter 2, pages 8–20. The ICH4 and P64H2 controllers have additional pins that are not shown in FIGS. 7 and 8 because these controllers are not connected to the circuit card slots; each controller typically has a total of about 600–700 pins.

A flow diagram that indicates a fabrication process for different circuit boards with different interconnections between controllers and receivers is given in FIG. 9, illustrating the economies of scale achievable with the invention. A single, common inventory 100 of raw circuit boards for each of the different board configurations is established. Since the volume of boards necessary to replenish the inventory is greater for all of the different circuit board configurations combined than for any single configuration, a large volume of boards can be ordered when the inventory needs to be replenished, making volume discounts more feasible. A common network of traces 52 and open circuits such as 54, 56 and 58 is formed on a desired number of boards, such as by conventional screen printing, in step 102. At this point all of the boards are still substantially the same. Individual sets of boards can then be individually configured from the common supply to satisfy market needs. Such configuration consists of loading the receivers, controllers and zero ohm resistors (or other interconnection network completion mechanism) required by each different configuration onto corresponding boards. In the example of FIG. 9, four different circuit board configurations are fabricated from the common board supply, with receivers, controllers and four different patterns of zero ohm resistors loaded onto the partially formed boards in steps 104, 106, 108 and 110, resulting in four different completed circuit board configurations. Each board preferably has its receivers, controllers and zero ohm resistors machine loaded simultaneously, thereby avoiding any additional fabrication steps to accommodate the zero ohm resistors.

While several illustrative embodiments of the invention have been shown and described, numerous variations and alternate embodiments will occur to those skilled in the art. Accordingly, it is intended that the invention be limited only in terms of the appended claims.

What is claimed is:

1. A configurable circuit board, comprising:
   a substrate;
   a plurality of electrical device receivers on said substrate, at least some of said receivers for receiving a selectable one of multiple different electrical devices having different respective interfaces with said receivers;
   a plurality of controllers on said substrate; and
   an electrically conductive interconnection network on said substrate interconnecting said controllers with said receivers, said network comprising sets of zero ohm resistor terminals that enable at least some of said receivers to be connected to different controllers, depending upon a pattern of zero ohm resistors connected across said terminals, wherein at least some of said sets of zero ohm resistor terminals are connected between different receivers.

2. The configurable circuit board of claim 1, wherein the terminals of at least some of said sets are separated by open circuits.

3. The configurable circuit board of claim 1, further comprising respective zero ohm resistors short circuiting the terminals of at least some of said sets.

4. The configurable circuit board of claim 1, said receivers comprising respective arrays of pin receptacles.

5. The configurable circuit board of claim 4, at least some of said receivers having different numbers of pin receptacles.

6. The configurable circuit board of claim 1, said circuit board comprising a computer mother board.

7. The configurable circuit board of claim 3, wherein the terminals of some of said sets are separated by open circuits.

8. The configurable circuit board of claim 5, wherein said receivers having different numbers of pin receptacles comprise a common core pin receptacle pattern.

9. A configurable circuit board, comprising:
a substrate;
a plurality of electrical device receivers on said substrate, at least some of said receivers for receiving a selectable one of multiple different electrical devices having different respective interfaces with said receivers;
a plurality of controllers on said substrate; and
an electrically conductive interconnection network on said substrate interconnecting said controllers with said receivers, said network comprising sets of zero ohm resistor terminals that enable at least some of said receivers to be connected to different controllers, depending upon a pattern of zero ohm resistors connected across said terminals, wherein at least some of said sets of zero ohm resistor terminals are connected between respective controllers and respective receivers.

10. The configurable circuit board of claim 9, wherein the terminals of at least some of said sets are separated by open circuits.

11. The configurable circuit board of claim 9, said receivers comprising respective arrays of pin receptacles.

12. The configurable circuit board of claim 9, said circuit board comprising a computer mother board.

13. The configurable circuit board of claim 10, further comprising respective zero ohm resistors short circuiting the terminals of at least some of said sets.

14. The configurable circuit board of claim 11, at least some of said receivers having different numbers of pin receptacles.

15. The configurable circuit board of claim 13, wherein the terminals of some of said sets are separated by open circuits.

16. The configurable circuit board of claim 14, wherein said receivers having different numbers of pin receptacles comprise a common core pin receptacle pattern.

* * * * *